United States Patent
Patthak et al.

(10) Patent No.: US 10,437,781 B2
(45) Date of Patent: *Oct. 8, 2019

(54) OZIP COMPRESSION AND DECOMPRESSION

(71) Applicant: Oracle International Corporation, Redwood Shores, CA (US)

(72) Inventors: Anindya Patthak, Fremont, CA (US); Victor Chen, Foster City, CA (US); Shasank Kisan Chavan, Menlo Park, CA (US); Jesse Kamp, Castro Valley, CA (US); Amit Ganesh, San Jose, CA (US); Vineet Marwah, San Ramon, CA (US)

(73) Assignee: Oracle International Corporation, Redwood Shores, CA (US)

( * ) Notice: Subject to any disclaimer, the term of this patent is extended or adjusted under 35 U.S.C. 154(b) by 140 days.

This patent is subject to a terminal disclaimer.

(21) Appl. No.: 15/640,286

(22) Filed: Jun. 30, 2017

(65) Prior Publication Data

US 2017/0300510 A1    Oct. 19, 2017

Related U.S. Application Data

(63) Continuation of application No. 14/337,113, filed on Jul. 21, 2014, now Pat. No. 9,697,221.

(Continued)

(51) Int. Cl.
| | |
|---|---|
| *G06F 16/00* | (2019.01) |
| *G06F 16/174* | (2019.01) |
| *H03M 7/30* | (2006.01) |
| *G06F 12/04* | (2006.01) |

(52) U.S. Cl.
CPC .......... *G06F 16/1744* (2019.01); *G06F 12/04* (2013.01); *H03M 7/3066* (2013.01);
(Continued)

(58) Field of Classification Search
CPC .. G06F 16/1744; G06F 16/28; G06F 16/2282; G06F 12/04; H03M 7/3066; H03M 7/3088
See application file for complete search history.

(56) References Cited

U.S. PATENT DOCUMENTS

| | | |
|---|---|---|
| 4,782,325 A | 11/1988 | Jeppsson et al. |
| 5,442,350 A | 8/1995 | Iyer |

(Continued)

FOREIGN PATENT DOCUMENTS

GB    1 332 631 A    10/1973

OTHER PUBLICATIONS

Phipps, Colin:, "Mapping Deflated Files", Internet Article, dated Jan. 6, 2013, http://zsync.moria.org.uk/paper/ch03s02.html, 3 pages.

(Continued)

*Primary Examiner* — Cheryl Lewis
(74) *Attorney, Agent, or Firm* — Hickman Palermo Becker Bingham LLP (57) ABSTRACT

A method, apparatus, and system for OZIP, a data compression and decompression codec, is provided. OZIP utilizes a fixed size static dictionary, which may be generated from a random sampling of input data to be compressed. Compression by direct token encoding to the static dictionary streamlines the encoding and avoids expensive conditional branching, facilitating hardware implementation and high parallelism. By bounding token definition sizes and static dictionary sizes to hardware architecture constraints such as word size or processor cache size, hardware implementation can be made fast and cost effective. For example, decompression may be accelerated by using SIMD instruction processor extensions. A highly granular block mapping in optional stored metadata allows compressed data to be accessed quickly at random, bypassing the processing over- (Continued)

head of dynamic dictionaries. Thus, OZIP can support low latency random data access for highly random workloads, such as for OLTP systems.

16 Claims, 5 Drawing Sheets

Related U.S. Application Data

(60) Provisional application No. 61/955,574, filed on Mar. 19, 2014.

(52) U.S. Cl.
CPC ....... *H03M 7/3088* (2013.01); *H03M 7/6005* (2013.01); *H03M 7/6011* (2013.01)

(56) References Cited

U.S. PATENT DOCUMENTS

| | | | |
|---|---|---|---|
| 5,610,603 A | 3/1997 | Plambeck | |
| 6,670,897 B1 | 12/2003 | Lin | |
| 7,026,962 B1 | 4/2006 | Emami | |
| 7,117,194 B2 | 10/2006 | Costantino | |
| 7,412,541 B1 | 8/2008 | Stadler | |
| 9,697,221 B2* | 7/2017 | Patthak | H03M 7/3066 |
| 2005/0022123 A1 | 1/2005 | Costantino | |
| 2008/0281784 A1 | 11/2008 | Zane et al. | |
| 2015/0088926 A1 | 3/2015 | Chavan et al. | |
| 2015/0269180 A1* | 9/2015 | Chen | H03M 7/3066 707/693 |
| 2017/0300510 A1* | 10/2017 | Patthak | H03M 7/3066 |

OTHER PUBLICATIONS

Khalid Sayood:, "Introduction to data Compression", Morgan Kaufmann Publisher, dated Dec. 1996, 4 pages.

U.S. Appl. No. 14/337,113, filed Jul. 21, 2014, Notice of Allowance, dated Jan. 27, 2017.

U.S. Appl. No. 14/337,113, filed Jul. 21, 2014, Office Action, dated Sep. 21, 2016.

* cited by examiner

202
DETERMINE A STATIC DICTIONARY FROM A PORTION OF INPUT DATA, THE STATIC DICTIONARY COMPRISING A PLURALITY OF ENTRIES UP TO A MAXIMUM NUMBER OF DICTIONARY ENTRIES, EACH OF THE PLURALITY OF ENTRIES MAPPING A TOKEN TO A DEFINITION HAVING A LENGTH UP TO A MAXIMUM BYTE SIZE THAT IS BOUNDED BY A HARDWARE SPECIFICATION

204
TOKENIZE THE INPUT DATA USING THE STATIC DICTIONARY TO GENERATE A PACKED SEQUENTIAL PLURALITY OF TOKENS, EACH OF THE PACKED SEQUENTIAL PLURALITY OF TOKENS HAVING A FIXED TOKEN SIZE THAT IS CONFIGURED TO ADDRESS THE MAXIMUM NUMBER OF DICTIONARY ENTRIES

206
STORE THE STATIC DICTIONARY, THE PACKED SEQUENTIAL PLURALITY OF TOKENS, AND OPTIONAL METADATA INCLUDING A BLOCK OFFSET MAPPING THAT INDICATES, FOR EACH OF A PLURALITY OF SEQUENTIAL DATA BLOCKS OF A DEFINED UNCOMPRESSED BLOCK SIZE, A TOKEN OFFSET WITHIN THE PACKED SEQUENTIAL PLURALITY OF TOKENS, WHEREIN THE PLURALITY OF SEQUENTIAL DATA BLOCKS CORRESPONDS TO THE INPUT DATA

212
RECEIVE A STATIC DICTIONARY COMPRISING A PLURALITY OF ENTRIES UP TO A MAXIMUM NUMBER OF DICTIONARY ENTRIES, EACH OF THE PLURALITY OF ENTRIES MAPPING A TOKEN TO A DEFINITION HAVING A LENGTH UP TO A MAXIMUM BYTE SIZE THAT IS BOUNDED BY A HARDWARE SPECIFICATION

214
RECEIVE A PACKED SEQUENTIAL PLURALITY OF TOKENS, EACH OF THE PACKED SEQUENTIAL PLURALITY OF TOKENS HAVING A FIXED TOKEN SIZE THAT IS CONFIGURED TO ADDRESS THE MAXIMUM NUMBER OF DICTIONARY ENTRIES

216
RECEIVE METADATA INCLUDING A BLOCK OFFSET MAPPING THAT INDICATES, FOR EACH OF A PLURALITY OF SEQUENTIAL DATA BLOCKS OF A DEFINED UNCOMPRESSED BLOCK SIZE, A TOKEN OFFSET WITHIN THE PACKED SEQUENTIAL PLURALITY OF TOKENS, WHEREIN THE PLURALITY OF SEQUENTIAL DATA BLOCKS CORRESPONDS TO UNPACKED OUTPUT DATA

218
RECEIVE A REQUEST TO PROVIDE THE UNPACKED OUTPUT DATA AT A REQUESTED OFFSET WITH A REQUESTED SIZE

220
DETERMINE, BASED ON THE METADATA, A SET OF TOKENS FROM THE PACKED SEQUENTIAL PLURALITY OF TOKENS TO ANSWER THE REQUEST

222
PROCESS THE SET OF TOKENS USING THE STATIC DICTIONARY TO WRITE INTO AN OUTPUT BUFFER IN RESPONSE TO THE REQUEST

FIG. 3

OZIP COMPRESSION AND DECOMPRESSION

CROSS-REFERENCE TO RELATED APPLICATIONS; BENEFIT CLAIM

This application is a Continuation of U.S. patent application Ser. No. 14/337,113, filed Jul. 21, 2014, which is hereby incorporated by reference as if fully set forth herein, under 35 U.S.C. §120. U.S. patent application Ser. No. 14/337,113 claims the benefit of U.S. Provisional Application No. 61/955,574, filed Mar. 19, 2014, which is hereby incorporated by reference in its entirety for all purposes as if fully set forth herein. The applicant(s) hereby rescind any disclaimer of claim scope in the parent application(s) or the prosecution history thereof and advise the USPTO that the claims in this application may be broader than any claim in the parent application(s).

FIELD OF THE INVENTION

The present disclosure relates to data compression, and more specifically, to high performance data compression and decompression suitable for cost effective hardware implementation while providing low latency random access support.

BACKGROUND

Data compression is an effective tool to manage ever growing data demands, enabling significant reductions for in-memory data sizes, storage footprints, and network bandwidth usage. However, data compression may add significant processing overhead, particularly when the compression codec is based on common compression codecs based on the Lempel-Ziv paradigm, such as ZLIB and LZO. These codecs tend to prioritize higher compression ratios for smaller disk storage footprints, rather than minimizing processing overhead.

For demanding, high bandwidth applications that utilize big data sets, including database management systems (DBMSs) for large enterprises or high-performance computing, performance is often measured and evaluated by query latency times and associated query throughput. To minimize such latency, data to be processed is cached in-memory when possible. Since the latency of reading data from disk storage is eliminated when data is cached in-memory, data compression may now comprise a significant portion of the latency. While common compression codecs can be implemented in hardware for reduced latency, the complexity of the algorithms may increase hardware development and fabrication costs. Furthermore, these compression codecs are typically designed for sequential access to data and may be unsuitable for supporting highly random data access, including online transaction processing (OLTP) workloads.

Based on the foregoing, there is a need for a method to provide cost effective, high performance data compression suitable for latency sensitive applications and/or highly random access workloads.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

General Overview

In an embodiment, OZIP, a data compression codec, is provided. OZIP is particularly suited for low latency hardware implementations and provides support for random access to compressed data. Thus, OZIP has special relevance for latency sensitive application workloads with random data access, such as databases for large enterprises and high-performance computing. By using OZIP, applications no longer need to make significant sacrifices in application performance to achieve high data compression ratios, enabling significant reductions for in-memory data sizes, storage footprints, and network bandwidth usage.

As discussed above, common data compression codecs based on the Lempel-Ziv paradigm, such as ZLIB and LZO, are not amenable to hardware implementations due to their complexity. In particular, the use of expensive conditional branching algorithms in software may render the corresponding hardware implementations as cost prohibitive, requiring high complexity coprocessors or ASICs.

On the other hand, OZIP largely avoids expensive conditional branching by compressing using a direct token encoding to a static dictionary, facilitating low cost and high performance hardware implementations. The static dictionary enables highly parallel processing as different portions of an OZIP compressed file can be processed independently without data dependencies. OZIP also provides several design optimizations for hardware acceleration, including token definition sizes and static dictionary sizes that are bounded by hardware architecture constraints such as word size or processor cache size. As a result, OZIP may be highly parallelized and accelerated by utilizing SIMD instruction extensions added to a general purpose processor, avoiding costly and inflexible hardware solutions such as coprocessors or specialized ASICs.

Additionally, common data compression codecs often provide insufficient random access granularity and are thus unsuited for online transaction processing (OLTP) systems or other systems that present highly random data access workloads. This lack of random-access granularity can stem from the use of a dynamic or sliding dictionary, which changes depending on the input. This often necessitates processing a large portion of the compressed file to build the correct dictionary for a random access.

On the other hand, OZIP utilizes a static dictionary and optionally embeds a highly granular block mapping in stored metadata, enabling any desired data portion to be quickly located using the block mapping and decompressed immediately with the known static dictionary, rather than waiting for a dynamic dictionary to be rebuilt. Thus, OZIP can support low latency random data access for highly random workloads, such as for OLTP systems.

OZIP Compression System Overview

Figure 1A:
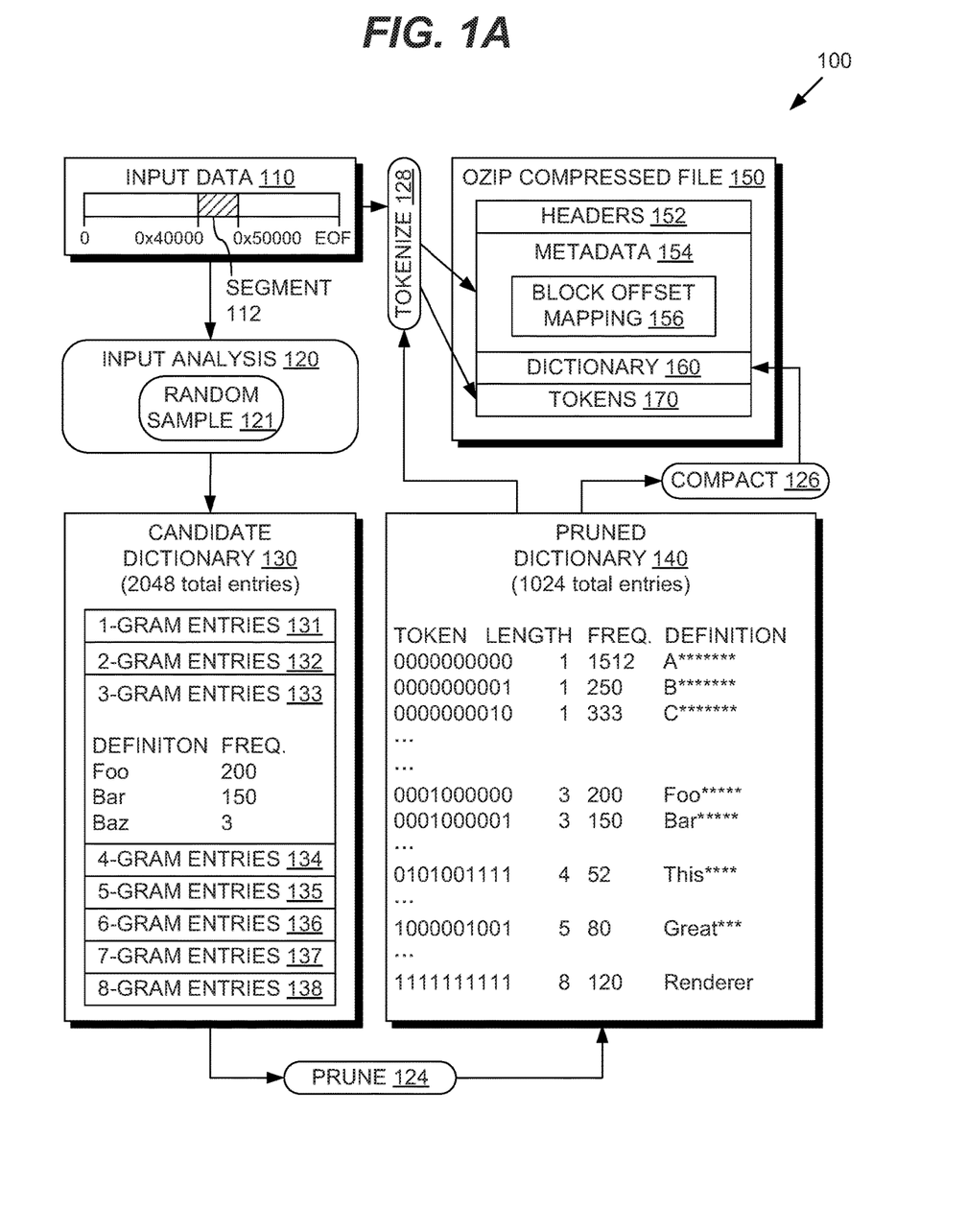
FIG. 1A is a block diagram that depicts an example system and data flow for compressing data using OZIP, according to an embodiment.

FIG. 1A is a block diagram that depicts an example system and data flow for compressing data using OZIP, according to an embodiment. System 100 of FIG. 1A includes input data 110, candidate dictionary 130, pruned dictionary 140, and OZIP compressed file 150. Input data 110 includes segment 112. Candidate dictionary 130 includes 1-gram entries 131, 2-gram entries 132, 3-gram entries 133, 4-gram entries 134, 5-gram entries 135, 6-gram entries 136, 7-gram entries 137, and 8-gram entries 138. OZIP compressed file 150 includes headers 152, metadata 154, block offset mapping 156, dictionary 160, and tokens 170. System 100 of FIG. 1A also illustrates the steps of input analysis 120, prune 124, compact 126, and tokenize 128. Input analysis 120 includes random sample 121.

As shown in FIG. 1A, compression begins by first analyzing the input data via input analysis 120, which may perform a quick random sample 121. A candidate dictionary 130 is then formed, which is then pared down to a smaller pruned dictionary 140 via prune 124. To save space, the pruned dictionary 140 may be further compressed via compact 126 before being stored as dictionary 160 in OZIP compressed file 150. The input data 110 is compressed via tokenize 128 with pruned dictionary 140. Metadata 154 is also generated during tokenize 128, including a block offset mapping 156 that maps token offsets in tokens 170 to uncompressed blocks in input data 110 of a specified block size granularity. Accordingly, quick random access to compressed data is provided. Note that in some embodiments, metadata 154, including block offset mapping 156, may be omitted from OZIP compressed file 150, for example if random access to data is not required. Similar to dictionary 160, metadata 154 may also be compacted to save space when stored in OZIP compressed file 150. Headers 152 are also added so that an OZIP decompressor can identify OZIP compressed file 150 and all of the elements contained within OZIP compressed file 150.

OZIP Compression Process

Figure 2A:
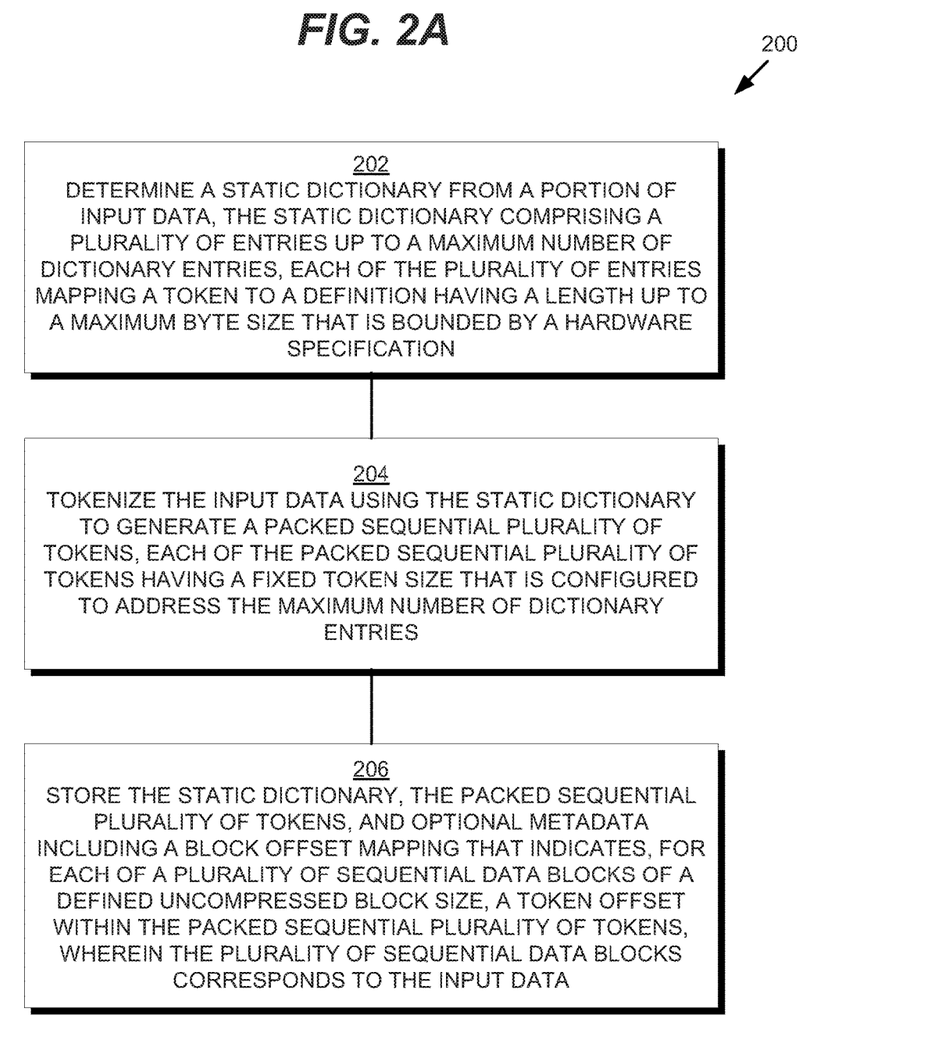
FIG. 2A is a flow diagram that depicts a process for compressing data using OZIP, according to an embodiment.

With a basic outline of system 100 now in place, it may be instructive to review a high level overview of the processing steps to compress data using OZIP. Turning to FIG. 2A, FIG. 2A is a flow diagram that depicts a process 200 for compressing data using OZIP, according to an embodiment. The steps of process 200 may be carried out on computer system 300 of FIG. 3, as described below under "HARDWARE SUMMARY".

Determining a Static Dictionary

At block 202 of process 200, referring to FIG. 1A, computer system 300 determines a static dictionary, or pruned dictionary 140, from at least a portion of input data 110. Pruned dictionary 140 comprises a plurality of entries up to a maximum number of dictionary entries, or 1024 in the example shown in FIG. 1A. Each of the entries in pruned dictionary 140 maps a token to a definition having a length up to a maximum byte size that is bounded by a hardware specification. In FIG. 1A, the maximum byte size is 8 bytes, which may match a 64-bit word size of processor 304 in FIG. 3. Thus, each definition can support a string of up to 8 bytes or 8-grams. Block 202 may be invoked in response to an OZIP compression program on computer system 300, which may be manually invoked by a user or automatically invoked via an application program interface (API) from an executing program, such as a database management system.

Input Data Analysis

Before the pruned dictionary 140 can be determined, a larger candidate dictionary 130 may first be built. Starting with input data 110, or the data to be compressed, OZIP needs access to at least a portion of input data 110, such as segment 112, to perform input analysis 120. As shown in input analysis 120, one method of analysis is to conduct a random sample 121, wherein a representative random sample, such as segment 112, is selected to build candidate dictionary 130 with estimated frequency values for all of input data 110. While segment 112 is shown to be a single contiguous sample between offsets 0x40000 and 0x50000, the random sample may also select multiple segments from input data 110.

Note that the use of random sample 121 allows input analysis 120 to avoid a full pass of the entire input data 110. This is particularly advantageous if input data 110 is very large and if input data 110 is known to have high Shannon entropy but low Rényi entropy, where a random sample will be generally representative of the whole input. Since OZIP is designed for best performance when compressing input data having the above described entropy pattern, OZIP may halt and redirect input data 110 to a different compression algorithm or even bypass compression altogether if other patterns of entropy are detected during input analysis 120.

To facilitate the generation of optimized dictionaries, portions of input data 110 may be classified and separately compressed by OZIP, providing separate dictionaries for each classification. Thus, for example, if the OZIP compression is to be used in a database context, then each column of a table may be separately OZIP compressed with separate dictionaries. On the other hand, columns with similar data may be combined into a single OZIP compressed file with a single combined dictionary. In the example shown in FIG. 1A, the entire input data 110 will be compressed by a single OZIP operation.

Building the Candidate Dictionary

Moving to candidate dictionary 130, it can be seen that the dictionary entries are divided into N-gram entries, where N is an integer value between 1 and 8. For example, the dictionary entry for "Foo" is categorized in 3-gram entries 133 since "Foo" is composed of three character bytes. Since the dictionary entries extend up to 8-gram entries 138, each definition may have a maximum byte size up to 8 bytes. While separate N-gram entries are provided for every possible N-gram from 1 to 8, some N-grams may be empty and have zero entries, depending on the data patterns within input data 110.

The maximum byte size may be configured to correspond to a hardware specification, for example based on a word size of a processor, including fractions and multiples of the word size such as a half word or a quad word. For example, 64-bit processor architectures may utilize a 64-bit word size and 64-bit registers, in which case a maximum byte size of 8 bytes for the dictionary definitions may be appropriate. Similarly, a maximum byte size of 16 bytes might be appropriate for a 128-bit word size. However, the maximum byte size for the dictionary definitions may also be configured based on other performance considerations and does not necessarily need to be based on the word size.

Within candidate dictionary 130, 1-gram entries 131 may be pre-populated with entries for all 256 byte values from 0x00 to 0xFF. In this manner, the compressor is guaranteed to be able to tokenize any input data. The remaining N-gram entries 132-138 may each be populated using various data structures such as tree structures built from segment 112 of input data 110. Thus, the N-gram entries 131-138 may each be maintained in decreasing order of frequency, with less frequent N-grams removed if the maximum possible number of candidate entries is exceeded, or 2048 total entries as shown in FIG. 1A. The decision to remove a certain N-gram may be further based on statistics, historical data, and heuristics. Since candidate dictionary 130 is only a list of candidates at this point, each entry does not yet have an assigned token value.

For brevity, example dictionary entries in candidate dictionary 130 are only shown for 3-gram entries 133, where the string "Foo" or the three consecutive bytes 0x46, 0x6F, and 0x6F appear 200 times within segment 112 of input data 110. The string "Bar" appears 150 times and the string "Baz" appears 3 times. Note that while the example definitions in FIG. 1A are shown as regular alphanumeric strings for simplicity, the definitions may of course include any arbitrary binary data values including null or 0x00 values, as the definitions in pruned dictionary 140 will always allocate the maximum byte size, using a separate length indicator rather than null-terminated strings.

Pruning the Candidate Dictionary

As shown in FIG. 1A, candidate dictionary 130 can include up to a maximum of 2048 total entries as candidates for consideration. This candidate maximum may be set to some value that is larger than the maximum number of entries for dictionary 160, or 1024 total entries as indicated by pruned dictionary 140. Prune 124 is configured to attempt to minimize a size of tokens 170. For example, prune 124 may remove the least frequently occurring candidates in candidate dictionary 130 until the desired number of entries is reached. Since the "Baz" string appears relatively infrequently or 3 times, the "Baz" string and other infrequently appearing strings may be removed in prune 124. Besides the raw frequency data, prune 124 may also consider statistics, historical data, and heuristics as well.

The maximum number of entries for dictionary 160 and pruned dictionary 140 may be configured to correspond to a hardware specification. For example, it may be desirable to be able to fit all of the dictionary definitions within a processor cache for faster compression and decompression. Since each definition occupies 8 bytes, 1024 definitions occupy 8192 bytes, or 8K. Note that regardless of the actual length or grams of the dictionary definition, 8 bytes are always reserved for each definition to facilitate hardware implementation. 8K of data may be small enough to fit entirely within a L1 processor cache of any modern processor. The maximum number of entries for dictionary 160 may thus be conservatively sized such that the dictionary definitions are likely to fit within a processor cache.

Additionally, by using a limited number of entries, each compressed token only needs a certain number of bits for all dictionary entries to be addressable. In the case of 1024 total entries, since 1024 is equivalent to 2^10, each token only requires 10 bits to be able to address all 1024 entries in the dictionary. Thus, the number of entries may also be limited to reduce the token bit size, which may help to achieve a higher compression ratio. While this token encoding does not accommodate run length encoding (RLE), this may be a reasonable tradeoff as RLE may be of limited effectiveness for high entropy data.

Examining pruned dictionary 140 in greater detail, it can be seen that each entry contains four columns: a token, the length, the definition, and optionally the frequency of the definition within the analyzed input data. In the example shown in FIG. 1A, the tokens are 10-bit values and the lengths are integers ranging from 1 to 8. To save space, the length and the frequency may be stored with only the minimum bits required for their required ranges. For example, since the lengths are always integers from 1 to 8 in the example shown in FIG. 1A, each length may be represented by a 3-bit value. Similarly, the number of bits allocated for the frequency column may also be limited depending on the maximum frequency encountered during input analysis 120. Further, while tokens are explicitly listed in pruned dictionary 140 for clarity, the tokens may be implicitly indicated by their index position in a data structure, such as an array. Additionally, as discussed above, each definition has the maximum byte size reserved, regardless of the actual length of the definition. As such, the extra remaining bytes can be zeroed out or uninitialized, which is indicated by a "*" marking indicating a padding or do not care byte.

Static Dictionary Mapping

For simplicity, only a selected portion of pruned dictionary 140 is illustrated in FIG. 1A. Since pruned dictionary 140 corresponds to the final static dictionary, at this point each definition is also assigned a specific token mapping. Since each token occupies a constant amount of space, or 10 bits in the example shown, the ordering of the token mapping can be selected arbitrarily. As previously discussed, all 1-gram entries 131 may be pre-populated so that any input data is guaranteed to be tokenized, and these 1-gram entries may be carried over to pruned dictionary 140. Thus, as shown in FIG. 1A, the 1-gram "A" is mapped to the 10-bit token "0000000000", the 1-gram "B" is mapped to the 10-bit token "0000000001", and the 1-gram "C" is mapped to the 10-bit token "0000000010", and so on. In some cases, dictionary 160 will be reused for additional input data or used as a basis for a new OZIP compressed file. In this case, it may be desirable to retain the optional frequency column of pruned dictionary 140 for use in further input analysis.

Next, the two most frequently occurring 3-gram entries 133, or "Foo" and "Bar", are shown, assigned 10-bit token values "0001000000" and "0001000001" respectively. Since the 3-gram entry "Baz" only occurs 3 times, it may have been removed in prune 124, and is thus absent from pruned dictionary 140. Additional example entries are also shown, including the 4-gram "This" with a token value "0101001111", the 5-gram "Great" with a token value "1000001001", and the 8-gram "Renderer" with a token value "1111111111".

Tokenizing the Input Data

With both input data 110 and pruned dictionary 140 available, tokenization of input data 110 can now proceed. At block 204 of process 200, referring to FIG. 1A, computer system 300 tokenizes input data 110 using a static dictionary, or pruned dictionary 140, to generate a packed sequential plurality of tokens, or tokens 170. As discussed above, since pruned dictionary 140 utilizes 10-bit tokens, each of tokens 170 will have a fixed token size (10 bits) that is configured to address the maximum number of dictionary entries (1024 or 2^10 entries) in pruned dictionary 140.

Since the process of tokenizing sequentially searches input data 110 for matching dictionary entries within pruned dictionary 140, various data structures and search techniques such as a trie search may be used for the tokenization process of block 204. Once a match is found, the token from pruned dictionary 140 may be written into tokens 170, which may be in a buffer allocated within main memory 306. Since the tokens may not align evenly to 8-bit byte boundaries, aligned blocks of contiguous tokens may be written, and padding may be added to the end of tokens 170 for byte alignment.

Storing the OZIP Compressed File

With the compressed data or tokens 170 now available, the writing and storing of OZIP compressed file 150 can now proceed. At block 206 of process 200, referring to FIG. 1A, computer system 300 stores dictionary 160, tokens 170, and optionally metadata 154. As discussed above, to save space, compact 126 may compress pruned dictionary 140 and/or metadata 154. However, in other embodiments, compact 126 may be omitted, in which case dictionary 160 may include pruned dictionary 140 as-is. Headers 152 may also be added so that an OZIP decompressor can identify OZIP compressed file 150 and all the elements within OZIP compressed file 150. In some embodiments, OZIP compressed file 150 may be stored in main memory 306 without persisting to storage device 310. In other embodiments, OZIP compressed file 150 may also be persisted to storage device 310.

Metadata 154 includes block offset mapping 156 that indicates, for each of a plurality of sequential data blocks of a defined uncompressed block size, a token offset within tokens 170, wherein the plurality of sequential data blocks corresponds to input data 110. Block offset mapping 156 may be created as part of tokenize 128 in block 204 above. As discussed above, storing metadata 154 is optional and may be omitted in certain embodiments. Block offset mapping 156 allows for fine grained random access to compressed data by mapping the offsets of uncompressed blocks to a specific token offset within tokens 170. The size of the uncompressed blocks can be defined according to the desired granularity of random access. For example, in a database context, the uncompressed blocks may be set to the size of a database block. Once a token offset is identified, the tokens can be immediately located and decompressed since a static dictionary 160 is utilized with fixed-size tokens, rather than a dynamic or sliding dictionary with variable sized tokens. A detailed discussion of the structure of block offset mapping 156 will be deferred until a discussion of the OZIP decompression process, which follows below.

OZIP Decompression System Overview

Figure 1B:
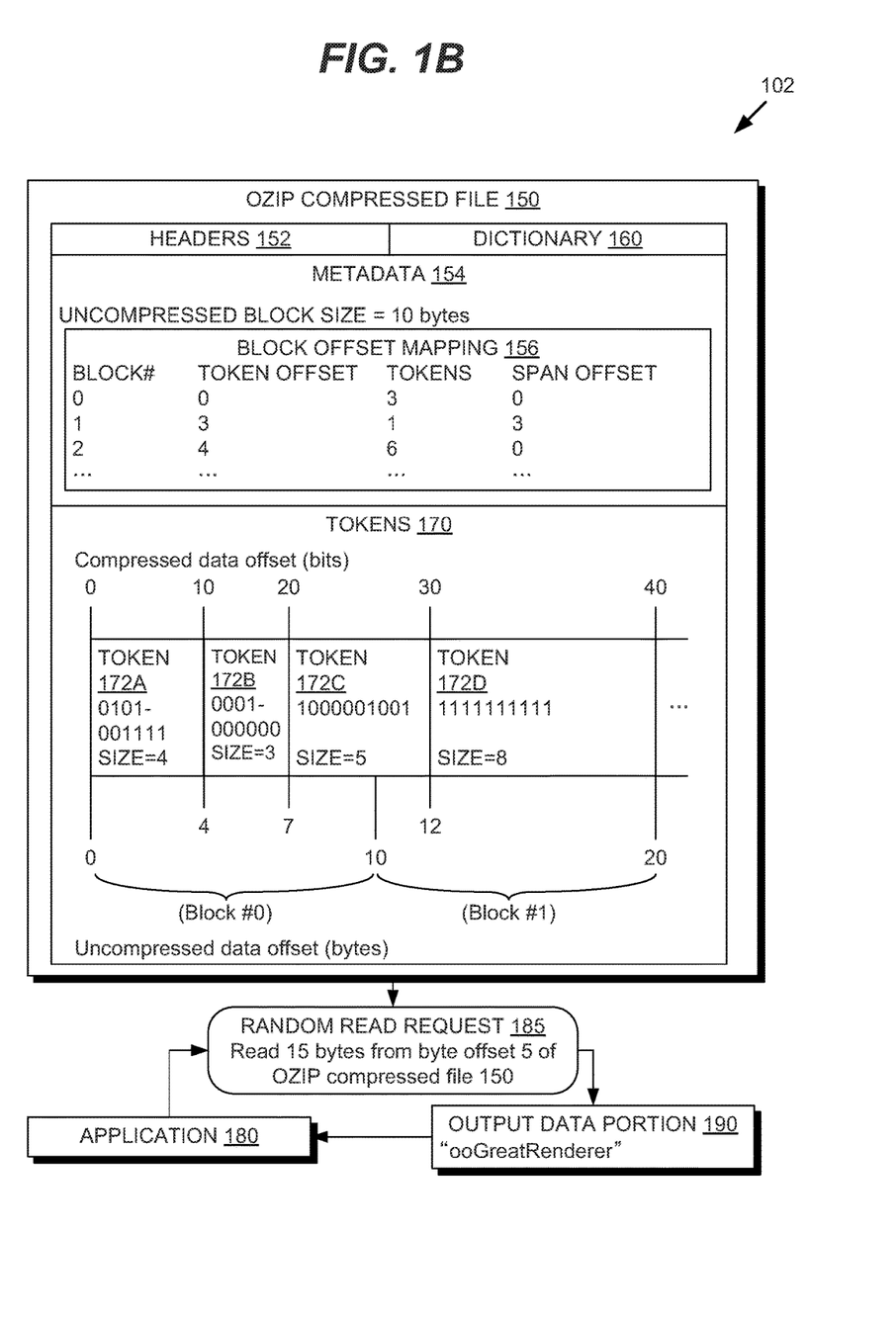
FIG. 1B is a block diagram that depicts an example system and data flow for decompressing data using OZIP, according to an embodiment.

FIG. 1B is a block diagram that depicts an example system and data flow for decompressing data using OZIP, according to an embodiment. System 102 of FIG. 1B includes OZIP compressed file 150, application 180, random read request 185, and output data portion 190. OZIP compressed file 150 includes headers 152, and metadata 154, dictionary 160, and tokens 170. Metadata 154 includes block offset mapping 156. Tokens 170 include token 172A, token 172B, token 172C, and token 172D. With respect to FIG. 1B, numbered elements may correspond to like numbered elements from FIG. 1A.

As shown in FIG. 1B, decompression begins by receiving a random read request 185 from application 180 for OZIP compressed file 150. Output data portion 190 is provided in response to random read request 185, which is provided back to the original requesting application 180, which may be a program such as a database management system executing on computer system 300 of FIG. 3.

OZIP Decompression Process

Figure 2B:
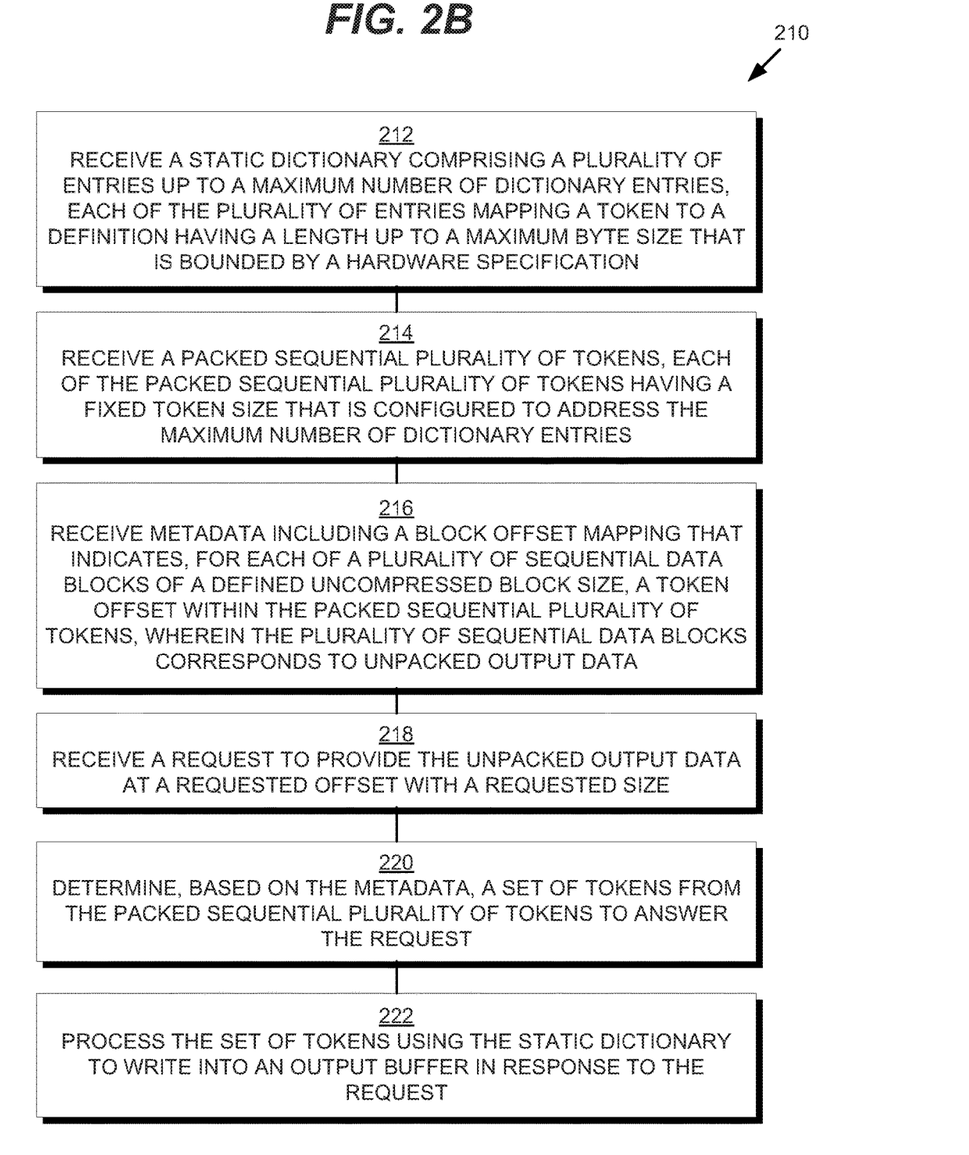
FIG. 2B is a flow diagram that depicts a process for decompressing data using OZIP, according to an embodiment.

With a basic outline of system 102 now in place, it may be instructive to review a high level overview of the processing steps to decompress data using OZIP. Turning to FIG. 2B, FIG. 2B is a flow diagram that depicts a process 210 for decompressing data using OZIP, according to an embodiment. The steps of process 210 may be carried out on computer system 300 of FIG. 3, as described below under "HARDWARE SUMMARY". Accordingly, OZIP compressed file 150 may be allocated in main memory 306 of computer system 300, and blocks 212, 214, and 216 may receive their respectively described elements from main memory 306.

Receiving the OZIP Compressed File

At block 212 of process 210, referring to FIG. 1B, computer system 300 receives a static dictionary, or dictionary 160, from OZIP compressed file 150. As previously discussed, dictionary 160 may be compressed via compact 126, in which case dictionary 160 may be decompressed prior to use. Dictionary 160 may have a structure corresponding to pruned dictionary 140, as shown in FIG. 1A and described above in block 202. Block 212 may be invoked in response to an OZIP decompression program on computer system 300, which may be manually invoked by a user or automatically invoked via an application program interface (API) from an executing program, such as a database management system.

At block 214 of process 210, referring to FIG. 1B, computer system 300 receives a packed sequential plurality of tokens, or tokens 170, from OZIP compressed file 150. A detailed description of the structure of tokens 170 will be deferred until the discussion of block 216 below.

At block 216 of process 210, referring to FIG. 1B, computer system 300 receives metadata 154 including block offset mapping 156, as described above in block 206. However, since process 210 is in the context of decompression rather than compression, block offset mapping 156 pertains to the uncompressed or unpacked output data, rather than to the uncompressed input data 110 of FIG. 1A, which does not exist in FIG. 1B.

Responding to a Full Read Request

While blocks 218, 220, and 222 illustrate a process for a random read example where a specific offset and size of data is requested, in some embodiments a full read request may be issued for all of the packed sequential plurality of tokens. This may be the case when metadata 154 is omitted from OZIP compressed file 150. In this case, block 218 receives a full read request or a read at offset 0 with a size equal to the size of input data 110, block 220 is skipped, and block 222 processes all of the packed sequential plurality of tokens as the "set of tokens". The specific steps within blocks 218, 220, and 222 are described in greater detail below under the heading "RESPONDING TO A RANDOM READ REQUEST".

Block Offset Mapping for Random Access

Before discussing blocks 218, 220, and 222 in detail, it may be instructive to first examine the structure of metadata 154. Accordingly, a more detailed structure of metadata 154 and block offset mapping 156 is illustrated in FIG. 1B. Metadata 154 specifies a defined uncompressed block size of 10 bytes, a relatively small block size chosen for illustration purposes. In a production environment, a very small uncompressed block size may be undesirable due to increased metadata and processing overhead. As previously discussed, the uncompressed block size can be configured according to the desired random access granularity and matched to application requirements.

Turning to block offset mapping 156, three example entries are shown for uncompressed block numbers 0, 1, and 2. As shown in FIG. 1B, four columns are defined: block # or the uncompressed block number, token offset or the position in tokens 170, tokens or the number of tokens referenced in the uncompressed block, and span offset or the uncompressed offset to read from a previous spanning token, if necessary. While block offset mapping 156 explicitly includes the block # and the token offset for clarity, the block # may also be implicitly determined from an index, for example if block offset mapping 156 is stored as an array. The token offset for any given block # may also be derived by summing the tokens in all prior blocks. Accordingly, to save space, block offset mapping 156 may not explicitly include the block # and the token offset when block offset mapping 156 is stored in OZIP compressed file 150.

Continuing with the example mappings in block offset mapping 156, referring to tokens 170, for block #0, or the uncompressed bytes starting at 0 and ending at 10, the token offset is 0, the tokens is 3, and the span offset is 0. In other words, a read of block #0 starts on the 0th token or at the $0^{th}$ bit in tokens 170, contains 3 tokens or tokens 172A-172C, and does not need to be concerned with a spanning token from a prior block. A spanning token is a token that maps to adjacent uncompressed blocks, which is illustrated by token 172C.

For block #1, or the uncompressed bytes starting at 10 and ending at 20, the token offset is 3, the tokens is 1, and the span offset is 3. In other words, a read of block #1 would normally start on the $3^{rd}$ token or at the $30^{th}$ bit in tokens 170, contains 1 token or token 172D, and must be adjusted by reading from an uncompressed offset of 3 bytes from the spanning token of the prior block, or token 172C. Thus, the read actually starts from the prior spanning token, or at the $20^{th}$ bit, to accommodate the spanning token, and only the uncompressed bytes starting from the $3^{rd}$ byte of the spanning token are read. As shown in tokens 170, this corresponds to reading the bytes of uncompressed token 172C at an offset of 3 from uncompressed data offset 7, or bytes 10 and 11. Note that token 172C is not counted as a token in block #1, since it was already counted in block #0.

The span offset shown in block offset mapping 156 is one specific method to accommodate spanning tokens. Other methods could also be utilized, such as by reserving dictionary entries for control codes or by splitting spanning tokens into separate tokens to guarantee alignment to uncompressed blocks. However, the span offset approach may be preferable to reduce overhead and processing complexity.

For block #2, or the uncompressed bytes starting at 20 and ending at 30, the token offset is 4, the tokens is 6, and the span offset is 0. In other words, a read of block #2 would start on the $4^{rd}$ token or at the $40^{th}$ bit in tokens 170, contains 6 tokens (not shown), and does not need to be concerned with a spanning token from a prior block.

Of course, a given read request may not necessarily align exactly to a block that is mapped in block offset mapping 156. However, by configuring the uncompressed block size to provide sufficient granularity, only a minimal amount of unnecessary tokens may be processed to begin answering the read request. As discussed above, the uncompressed block size might be matched to application requirements, such as a database block size, in which case the granularity will exactly match application needs while avoiding any processing of unnecessary tokens. Thus, the presence of block offset mapping 156 combined with the static dictionary 160 enables quick random access to OZIP compressed data, or tokens 170.

Responding to a Random Read Request

At block 218 of process 210, referring to FIG. 1B, computer system 300 receives random read request 185 from application 180 to provide output data portion 190. As previously discussed, application 180 may be a program executing on computer system 300, such as a database management system. As shown in FIG. 1B, random read request 185 is for unpacked output data corresponding to the uncompressed portion of OZIP compressed file 150 starting from the $5^{th}$ byte, containing 15 bytes and ending at but not including the $20^{th}$ byte. Thus, the ending is the $19^{th}$ byte, inclusive.

At block 220 of process 210, referring to FIG. 1B, computer system 300 determines, based on metadata 154, a set of tokens from tokens 170 to answer random read request 185. More specifically, the requested starting offset of the $5^{th}$ byte and the requested ending offset of the 19th byte may be integer divided by the uncompressed block size, or 10 bytes, to determine the appropriate starting and ending block #. Thus, the starting block is 5/10=block #0, and the ending block is 19/10=block #1. Accordingly, as indicated by block offset mapping 156, the set of tokens may be determined to include 4 tokens from tokens 170, or the total number of tokens mapped to block #0 (3), block #1 (1), and any and all in-between blocks (none). The set of tokens may also include an additional spanning token if the requested starting offset is for a block that indicates a non-zero span offset.

Figure 3:
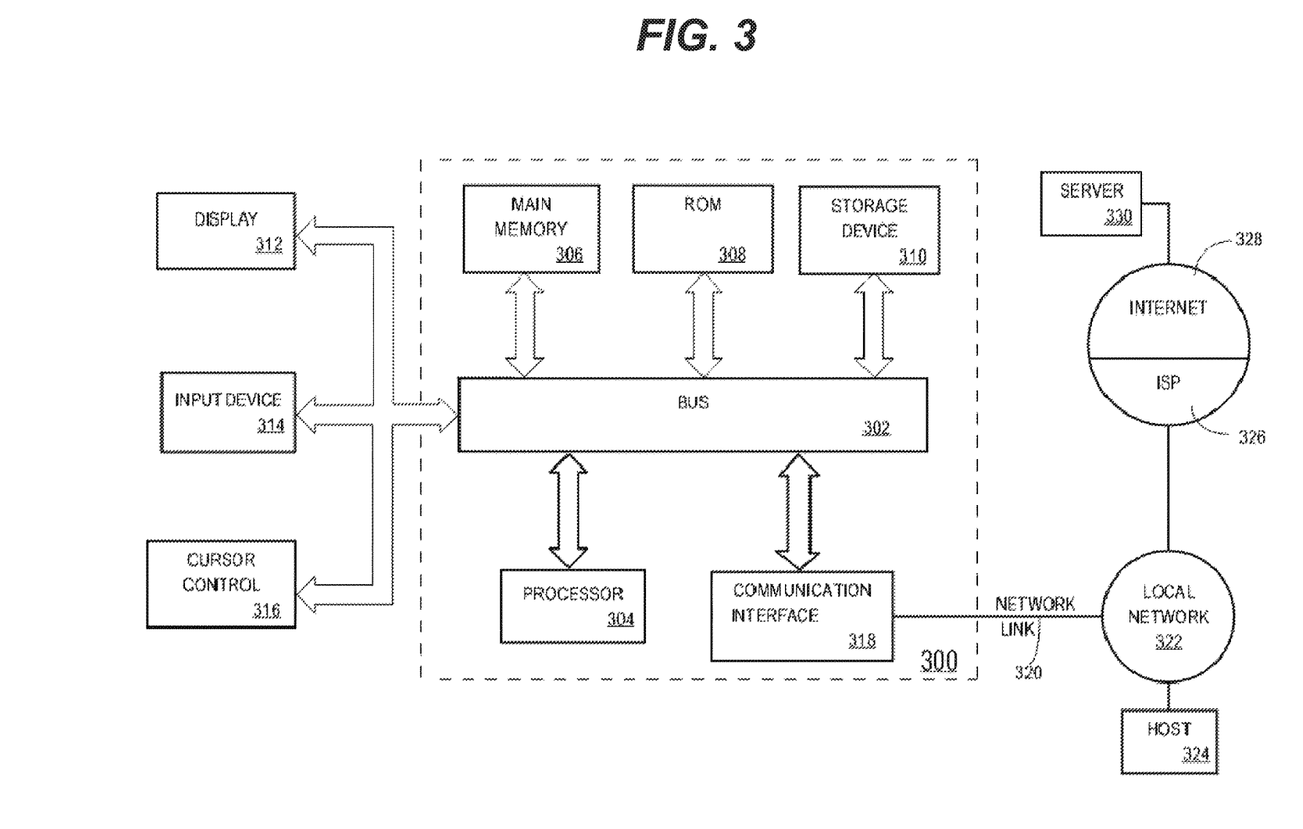
FIG. 3 is a block diagram of a computer system on which embodiments may be implemented.

At block 222 of process 210, referring to FIG. 1B, computer system 300 processes the set of tokens determined from block 220 using dictionary 160 to write output data portion 190 into an output buffer, which may be allocated in main memory 306 of FIG. 3. While the set of tokens was determined to include 4 tokens in block 220 above, less than 4 tokens may be actually processed and decompressed, as the tokens in the starting and ending blocks that are unrelated to random read request 185 may not necessarily be processed and decompressed.

Using block offset mapping 156, the starting block #0 corresponds to token offset 0 or token 172A at bit offset 0*10=0. However, because the remainder of the integer division is 5, the tokens must first be parsed to find the precise token to begin decompression. Thus, token 172A may be read and the indicated size of 4 bytes may be added to a running counter that is initialized to zero. Note that since the size of each token 172A-172D is actually looked up in dictionary 160, the sizes are only shown in tokens 172A-172D for clarity reasons. Since the next token or token 172B has a size of 3 bytes, which would cause the running counter to exceed the remainder of 5, actual decompression starts at token 172B.

Looking up token 172B in dictionary 160, or referring to pruned dictionary 140 of FIG. 1A, token 172B corresponds to "Foo". However, to begin reading at the correct offset, the uncompressed data is read at a data offset of the remainder minus the running counter, or 5−4=1. Thus, only the "oo" portion is read from "Foo". Additional tokens may be decompressed until the requested size of data is retrieved, or 15 bytes as per random read request 185. Thus, the "oo" portion is concatenated with decompressed tokens 172C and 172D, or "Great" and "Renderer", as shown in output data portion 190. Accordingly, block 222 processes 4 tokens but only decompresses 3 tokens. Output data portion 190 may then be passed back to application 180 in response to random read request 185, completing process 210.

Hardware Accelerated OZIP Decompression

To facilitate hardware implementation, the maximum byte length or the entire 8 bytes of the definition may always be written when a single token is decompressed, regardless of the actual length of the definition. The write pointer pointing to the output buffer is moved forward by the length so that the next token is decompressed at the correct position. In this manner, conditional branching logic is avoided, as the maximum number of bytes is always written for the definition of each token and the pointer is always increased by the associated length. For the special case of a random read request with starting or ending offset in the middle of a token, the token may be fully decompressed but with the portions irrelevant to the random read request truncated. Thus, hardware implementations of OZIP decompression are readily provided in a high performance, cost effective manner.

OZIP decompression may be further accelerated by concatenating multiple decompressed tokens at a time with a single processor instruction. For example, processor 304 may support an instruction "vlbpk", or "Variable Length Byte Pack", which accepts two SIMD registers as inputs: a first register that includes the definitions with their maximum byte sizes, and a second register that includes lengths of the corresponding definitions. The output is a SIMD register with the definitions truncated to the specified lengths and concatenated together, which can then be written into the output buffer (and truncated if necessary). Other approaches such as GPU acceleration may also be pursued.

For example, assume that input data 110 begins at offset 0 with 20 bytes of data corresponding to the string "ThisFooGreatRenderer". Tokenizing or compressing with pruned dictionary 140, this corresponds to tokens 172A-172D as shown in tokens 170 of FIG. 1B. If random read request 185 instead requested to read 20 bytes from byte offset 0, then tokens 172A-172D are all to be fully decompressed. Rather than processing tokens 172A-172D and writing decompressed tokens to output data portion 190 one at a time, the "vlbpk" instruction may be utilized to concatenate multiple decompressed tokens at once.

Thus, by looking up tokens 172A-172D in dictionary 160, a first SIMD register that is at least 256 bits may be filled with the definitions mapped for tokens 172A-172D, and a second SIMD register may be filled with the corresponding lengths of tokens 172A-172D:

SIMD register 1 (at least 256 bits): "This**Foo*Great*Renderer"

SIMD register 2 (at least 32 bits): "0x04|0x03|0x05|0x08"

where * indicates a padding or do not care byte.

The above example assumes 8 bit values for the lengths in SIMD register 2, although other bit sizes may be specified by supporting a bit size input in the "vlbpk" instruction, by modifying a flag register, or by hardcoding a different bit size in processor 304. Additionally, other embodiments may accept pointers to memory rather than SIMD registers. The output SIMD register is populated as follows:

Output SIMD register (at least 256 bits): "ThisFooGreatRenderer**********" Since the offsets to write each definition from SIMD register 1 are known by examining SIMD register 2, each definition can be written concurrently to the correct location in the output SIMD register. Once the output SIMD register is populated, then all bits of the register may be written to the output buffer, with the write pointer advanced in the output buffer by the sum of the lengths, or 20 bytes in this example. Thus, a parallelized, hardware accelerated packing instruction may be provided for processor 304** to improve OZIP decompression performance.

Even further, if a large amount of data is being requested for decompression, multiple threads can be deployed to decompress different portions of the OZIP compressed file concurrently, since each portion can be processed independently without any data dependencies due to the use of a static dictionary 160. However, some coordination is required to ensure that the different decompressed portions are placed at the proper offsets.

Hardware Summary

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

For example, FIG. 3 is a block diagram that illustrates a computer system 300 upon which an embodiment of the invention may be implemented. Computer system 300 includes a bus 302 or other communication mechanism for communicating information, and a hardware processor 304 coupled with bus 302 for processing information. Hardware processor 304 may be, for example, a general purpose microprocessor.

Computer system 300 also includes a main memory 306, such as a random access memory (RAM) or other dynamic storage device, coupled to bus 302 for storing information and instructions to be executed by processor 304. Main memory 306 also may be used for storing temporary variables or other intermediate information during execution of instructions to be executed by processor 304. Such instructions, when stored in storage media accessible to processor 304, render computer system 300 into a special-purpose machine that is customized to perform the operations specified in the instructions.

Computer system 300 further includes a read only memory (ROM) 308 or other static storage device coupled to bus 302 for storing static information and instructions for processor 304. A storage device 310, such as a magnetic disk or optical disk, is provided and coupled to bus 302 for storing information and instructions.

Computer system 300 may be coupled via bus 302 to a display 312, such as a cathode ray tube (CRT), for displaying information to a computer user. An input device 314, including alphanumeric and other keys, is coupled to bus 302 for communicating information and command selections to processor 304. Another type of user input device is cursor control 316, such as a mouse, a trackball, or cursor direction keys for communicating direction information and command selections to processor 304 and for controlling cursor movement on display 312. This input device typically has two degrees of freedom in two axes, a first axis (e.g., x) and a second axis (e.g., y), that allows the device to specify positions in a plane.

Computer system 300 may implement the techniques described herein using customized hard-wired logic, one or more ASICs or FPGAs, firmware and/or program logic which in combination with the computer system causes or programs computer system 300 to be a special-purpose machine. According to one embodiment, the techniques herein are performed by computer system 300 in response to processor 304 executing one or more sequences of one or more instructions contained in main memory 306. Such instructions may be read into main memory 306 from another storage medium, such as storage device 310. Execution of the sequences of instructions contained in main memory 306 causes processor 304 to perform the process steps described herein. In alternative embodiments, hard-wired circuitry may be used in place of or in combination with software instructions.

The term "storage media" as used herein refers to any media that store data and/or instructions that cause a machine to operation in a specific fashion. Such storage media may comprise non-volatile media and/or volatile media. Non-volatile media includes, for example, optical or magnetic disks, such as storage device 310. Volatile media includes dynamic memory, such as main memory 306. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 302. Transmission media can also take the form of acoustic or light waves, such as those generated during radio-wave and infra-red data communications.

Various forms of media may be involved in carrying one or more sequences of one or more instructions to processor 304 for execution. For example, the instructions may initially be carried on a magnetic disk or solid state drive of a remote computer. The remote computer can load the instructions into its dynamic memory and send the instructions over a telephone line using a modem. A modem local to computer system 300 can receive the data on the telephone line and use an infra-red transmitter to convert the data to an infra-red signal. An infra-red detector can receive the data carried in the infra-red signal and appropriate circuitry can place the data on bus 302. Bus 302 carries the data to main memory 306, from which processor 304 retrieves and executes the instructions. The instructions received by main memory 306 may optionally be stored on storage device 310 either before or after execution by processor 304.

Computer system 300 also includes a communication interface 318 coupled to bus 302. Communication interface 318 provides a two-way data communication coupling to a network link 320 that is connected to a local network 322. For example, communication interface 318 may be an integrated services digital network (ISDN) card, cable modem, satellite modem, or a modem to provide a data communication connection to a corresponding type of telephone line. As another example, communication interface 318 may be a local area network (LAN) card to provide a data communication connection to a compatible LAN. Wireless links may also be implemented. In any such implementation, communication interface 318 sends and receives electrical, electromagnetic or optical signals that carry digital data streams representing various types of information.

Network link 320 typically provides data communication through one or more networks to other data devices. For example, network link 320 may provide a connection through local network 322 to a host computer 324 or to data equipment operated by an Internet Service Provider (ISP) 326. ISP 326 in turn provides data communication services through the world wide packet data communication network now commonly referred to as the "Internet" 328. Local network 322 and Internet 328 both use electrical, electromagnetic or optical signals that carry digital data streams. The signals through the various networks and the signals on network link 320 and through communication interface 318, which carry the digital data to and from computer system 300, are example forms of transmission media.

Computer system 300 can send messages and receive data, including program code, through the network(s), network link 320 and communication interface 318. In the Internet example, a server 330 might transmit a requested code for an application program through Internet 328, ISP 326, local network 322 and communication interface 318.

The received code may be executed by processor 304 as it is received, and/or stored in storage device 310, or other non-volatile storage for later execution.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method comprising:
   compressing a database table comprising a plurality of columns of data, by:
      determining a static dictionary from a portion of input data from one or more columns of data of the plurality of columns of data, the static dictionary comprising a plurality of entries up to a maximum number of dictionary entries, each of the plurality of entries mapping a token to a definition having a length up to a maximum byte size that is bounded by a hardware specification;
      tokenizing the one or more columns of data using the static dictionary to generate a packed sequential plurality of tokens, each of the packed sequential plurality of tokens having a fixed token size that is configured to address the maximum number of dictionary entries; and
      storing the static dictionary and the packed sequential plurality of tokens;
   wherein the method is performed by one or more computing devices.

2. The method of claim 1, wherein the method further comprises:
   repeating the determining, tokenizing, and storing for all columns of data of the plurality of columns of data.

3. The method of claim 1, wherein the method further comprises storing metadata including a block offset mapping that indicates, for each of a plurality of sequential data blocks of a defined uncompressed block size, a token offset within the packed sequential plurality of tokens, wherein the plurality of sequential data blocks corresponds to the input data.

4. The method of claim 1, wherein said determining comprises:
   searching said one or more columns of data to build a candidate dictionary having a candidate number of dictionary entries greater than the maximum number of dictionary entries, the candidate dictionary including all 1-gram entries and most frequently occurring N-gram entries, wherein N is an integer value from 2 to the maximum byte size;
   pruning the candidate dictionary to form the static dictionary having the maximum number of dictionary entries, wherein the pruning is configured to attempt to minimize a size of the packed sequential plurality of tokens.

5. The method of claim 1, wherein said static dictionary further includes a frequency count for each of the plurality of entries.

6. The method of claim 1, wherein said portion of said input data is randomly sampled from said input data.

7. The method of claim 1, wherein the hardware specification is based on a word size of the one or more computing devices.

8. The method of claim 1, wherein the maximum number of dictionary entries is configured such that each definition of the plurality of entries in the static dictionary can fit within a processor cache of the one or more computing devices.

9. One or more non-transitory computer-readable storage media storing instructions that, when executed by one or more processors, cause:
   compressing a database table comprising a plurality of columns of data, by:
      determining a static dictionary from a portion of input data from one or more columns of data of the plurality of columns of data, the static dictionary comprising a plurality of entries up to a maximum number of dictionary entries, each of the plurality of entries mapping a token to a definition having a length up to a maximum byte size that is bounded by a hardware specification;
      tokenizing the one or more columns of data using the static dictionary to generate a packed sequential plurality of tokens, each of the packed sequential plurality of tokens having a fixed token size that is configured to address the maximum number of dictionary entries; and
      storing the static dictionary and the packed sequential plurality of tokens.

10. The one or more non-transitory computer-readable storage media of claim 9, wherein the instructions comprise instructions that, when executed by one or more processors, cause:
    repeating the determining, tokenizing, and storing for all columns of data of the plurality of columns of data.

11. The one or more non-transitory computer-readable storage media of claim 9, wherein the instructions further comprise instructions that, when executed by one or more processors, cause storing metadata including a block offset mapping that indicates, for each of a plurality of sequential data blocks of a defined uncompressed block size, a token offset within the packed sequential plurality of tokens, wherein the plurality of sequential data blocks corresponds to the input data.

12. The one or more non-transitory computer-readable storage media of claim 9, wherein said determining comprises:
    searching said one or more columns of data to build a candidate dictionary having a candidate number of dictionary entries greater than the maximum number of dictionary entries, the candidate dictionary including all 1-gram entries and most frequently occurring N-gram entries, wherein N is an integer value from 2 to the maximum byte size;
    pruning the candidate dictionary to form the static dictionary having the maximum number of dictionary entries, wherein the pruning is configured to attempt to minimize a size of the packed sequential plurality of tokens.

13. The one or more non-transitory computer-readable storage media of claim 9, wherein said static dictionary further includes a frequency count for each of the plurality of entries.

14. The one or more non-transitory computer-readable storage media of claim 9, wherein said portion of said input data is randomly sampled from said input data.

15. The one or more non-transitory computer-readable storage media of claim 9, wherein the hardware specification is based on a word size of the one or more computing devices.

16. The one or more non-transitory computer-readable storage media of claim 9, wherein the maximum number of dictionary entries is configured such that each definition of the plurality of entries in the static dictionary can fit within a processor cache of the one or more computing devices.

\* \* \* \* \*

UNITED STATES PATENT AND TRADEMARK OFFICE
CERTIFICATE OF CORRECTION

PATENT NO. : 10,437,781 B2
APPLICATION NO. : 15/640286
DATED : October 8, 2019
INVENTOR(S) : Patthak et al.

Page 1 of 1

It is certified that error appears in the above-identified patent and that said Letters Patent is hereby corrected as shown below:

In the Specification

In Column 9, Line 51, delete "0th" and insert -- $0^{th}$ --, therefor.

In Column 10, Line 16, delete "$4^{rd}$" and insert -- $4^{th}$ --, therefor.

In Column 10, Line 50, delete "19th" and insert -- $19^{th}$ --, therefor.

Signed and Sealed this
Eighth Day of September, 2020

Andrei Iancu
*Director of the United States Patent and Trademark Office*